(12) United States Patent
Ueda

(10) Patent No.: US 11,063,243 B2
(45) Date of Patent: Jul. 13, 2021

(54) DISPLAY APPARATUS AND ELECTRONIC DEVICE

(71) Applicant: SONY CORPORATION, Tokyo (JP)

(72) Inventor: Daisuke Ueda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/487,539

(22) PCT Filed: Feb. 9, 2018

(86) PCT No.: PCT/JP2018/004724
§ 371 (c)(1),
(2) Date: Aug. 21, 2019

(87) PCT Pub. No.: WO2018/179914
PCT Pub. Date: Oct. 4, 2018

(65) Prior Publication Data
US 2020/0013990 A1   Jan. 9, 2020

(30) Foreign Application Priority Data

Mar. 28, 2017  (JP) .............................. JP2017-063002

(51) Int. Cl.
*H01L 51/52*  (2006.01)
*H01L 27/32*  (2006.01)

(52) U.S. Cl.
CPC .......... *H01L 51/5268* (2013.01); *H01L 27/32* (2013.01); *H01L 51/5271* (2013.01)

(58) Field of Classification Search
CPC ... H01L 27/32; H01L 27/322; H01L 27/3213; H01L 51/5268; H01L 51/5271; H01L 51/5275; H05B 33/02; H05B 33/12; H05B 33/24; G02B 5/20; G09F 9/00; G09F 9/30
See application file for complete search history.

(56) References Cited

U.S. PATENT DOCUMENTS

| 2006/0088951 A1 | 4/2006 | Hayashi et al. |
| 2014/0127480 A1 | 5/2014 | Masuda |
| 2014/0168572 A1* | 6/2014 | Iwata .................... H05B 33/14 349/61 |
| 2015/0008399 A1 | 1/2015 | Choi et al. |

(Continued)

FOREIGN PATENT DOCUMENTS

| CN | 1764335 A | 4/2006 |
| CN | 104282715 A | 1/2015 |

(Continued)

OTHER PUBLICATIONS

International Search Report and Written Opinion of PCT Application No. PCT/JP2018/004724, dated May 1, 2018, 10 pages of ISRWO.

*Primary Examiner* — Galina G Yushina
(74) *Attorney, Agent, or Firm* — Chip Law Group

(57) ABSTRACT

There is provided a display apparatus that includes a plurality of light-emitting elements that constitutes pixels, a light guiding/scattering layer that is provided on the plurality of light-emitting elements and scatters light emitted from the plurality of light-emitting elements, and a reflection partition wall that separates portions of the light guiding/scattering layer corresponding to each of the pixels and reflects the light emitted from the plurality of light-emitting elements.

8 Claims, 9 Drawing Sheets

(56) References Cited

U.S. PATENT DOCUMENTS

| | | | |
|---|---|---|---|
| 2015/0076473 A1 | 3/2015 | Miyake | |
| 2016/0041430 A1* | 2/2016 | Lee | G02F 1/133514 349/96 |
| 2016/0126501 A1 | 5/2016 | Kim et al. | |
| 2018/0061894 A1* | 3/2018 | Kim | H01L 51/5268 |

FOREIGN PATENT DOCUMENTS

| | | |
|---|---|---|
| JP | 2008-226859 A | 9/2008 |
| JP | 2015-162280 A | 9/2015 |
| JP | 2016-122606 A | 7/2016 |
| KR | 10-2006-0054035 A | 5/2006 |
| KR | 10-2015-0004974 A | 1/2015 |
| KR | 10-2015-0032482 A | 3/2015 |
| KR | 10-2016-0050848 A | 5/2016 |
| TW | 201515215 A | 4/2015 |
| WO | 2012/164612 A1 | 12/2012 |
| WO | 2016/204166 A1 | 12/2016 |
| WO | 2017/033771 A1 | 3/2017 |

\* cited by examiner

DISPLAY APPARATUS AND ELECTRONIC DEVICE

CROSS REFERENCE TO RELATED APPLICATIONS

This application is a U.S. National Phase of International Patent Application No. PCT/JP2018/004724 filed on Feb. 9, 2018, which claims priority benefit of Japanese Patent Application No. JP 2017-063002 filed in the Japan Patent Office on Mar. 28, 2017. Each of the above-referenced applications is hereby incorporated herein by reference in its entirety.

TECHNICAL FIELD

The present disclosure relates to a display apparatus and an electronic device.

BACKGROUND ART

In recent years, display apparatuses that use an organic electroluminescence element (what is known as an organic EL element) as a light-emitting element has been prevailing. The organic EL element is a self-emitting element that emits light by low voltage direct current drive and includes, for example, a stack of organic layers including a light emitting layer or the like between an anode and a cathode.

For example, Patent Document 1 described below discloses a display apparatus in which a plurality of organic EL elements including a stacked structure of a first electrode layer, a light emitting layer, and a second electrode layer is provided on a first substrate, and the plurality of organic EL elements is sealed by a second substrate arranged opposite the first substrate.

CITATION LIST

Patent Document

Patent Document 1: Japanese Patent Application Laid-Open No. 2014-44793

SUMMARY OF THE INVENTION

Problems to be Solved by the Invention

However, in the organic EL element, light emitted inside the organic layer isotropically travels in various directions. Therefore, for example, with the display apparatus disclosed in Patent Document 1, only part of the light emitted from the organic EL element can be extracted on a display surface, and therefore a sufficient brightness cannot be obtained. Furthermore, in a case where the density of current applied to the organic EL element is increased in order to increase the brightness of the display apparatus, a load on the organic EL element is increased, the power consumption is increased, and the lifetime of the organic EL element is reduced.

Now, the present disclosure proposes novel and improved display apparatus and electronic device that can increase the efficiency of light extraction from a light-emitting element.

Solutions to Problems

According to the present disclosure, there is provided a display apparatus including: a plurality of light-emitting elements that constitutes pixels; a light guiding/scattering layer that is provided on the plurality of light-emitting elements and scatters light emitted from the plurality of light-emitting elements; and a reflection partition wall that separates portions of the light guiding/scattering layer corresponding to each of the pixels and reflects the light emitted from the plurality of light-emitting elements.

Furthermore, according to the present disclosure, there is provided an electronic device including: a display unit including a plurality of light-emitting elements that constitutes pixels, a light guiding/scattering layer that is provided on the plurality of light-emitting elements and scatters light emitted from the plurality of light-emitting elements, and a reflection partition wall that separates portions of the light guiding/scattering layer corresponding to each of the pixels and reflects the light emitted from the plurality of light-emitting elements; and a display control unit that controls the display unit.

According to the present disclosure, it is possible to increase the efficiency of light extraction from the light-emitting element by scattering the light emitted from the light-emitting element using the light guiding/scattering layer. Furthermore, according to the present disclosure, it is possible to prevent color mixture between adjacent pixels or light-emitting elements by providing a reflection partition wall that separates a light guiding/scattering layer.

Effects of the Invention

According to the present disclosure described above, it is possible to provide a display apparatus and an electronic device that have increased efficiency of light extraction from a light-emitting element.

Note that the effects described above are not necessarily limitative. With or in the place of the above effects, there may be achieved any one of the effects described in this specification or other effects that may be grasped from this specification.

MODE FOR CARRYING OUT THE INVENTION

Figure 1A:
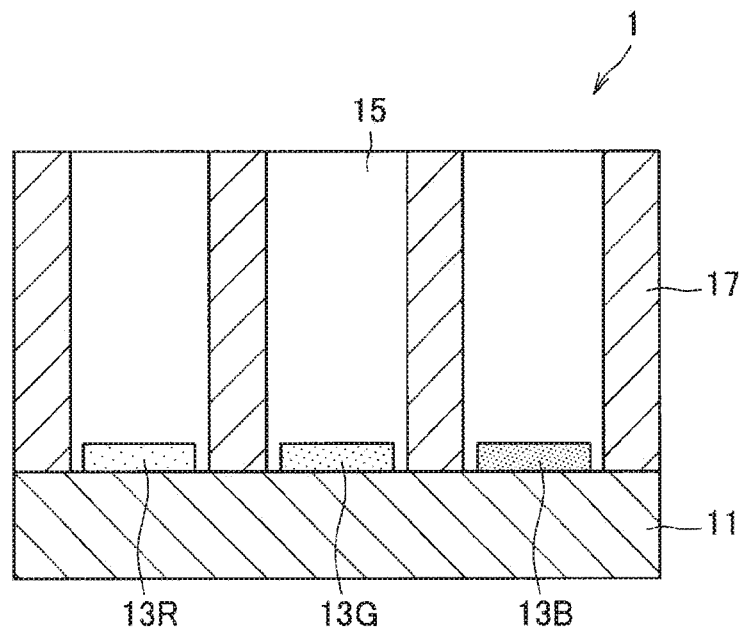
FIG. 1A is a cross-sectional view schematically illustrating a stacked structure of a display apparatus of according to a first configuration.

Preferred embodiments of the present disclosure will be described in detail below with reference to the accompanying drawings. Note that, in this description and the drawings, configuration elements that have substantially the same function and configuration are denoted with the same reference numerals, and repeated explanation is omitted.

Note that, description is given in the order described below.

1. Schematic configuration of the display apparatus
1.1. First configuration
1.2. Second configuration
2. Detailed configuration of the display apparatus
2.1. First specific example
2.2. Second specific example
2.3. Third specific example
2.4. Fourth specific example
2.5. Variation example
3. Example of application of the display apparatus 1. Schematic Configuration of the Display Apparatus First, referring to FIGS. 1A, 1B, 2A, and 2B, a schematic configuration of a display apparatus according to an embodiment of the present disclosure is described. Note that, in the present specification, a stack direction of each layer of the display apparatus is expressed as an up-and-down direction, a direction in which a support substrate is arranged with reference to a light-emitting element is expressed as a downward direction, and a direction in which an opposite substrate is arranged is expressed as an upward direction.

1.1. First Configuration

Figure 1B:
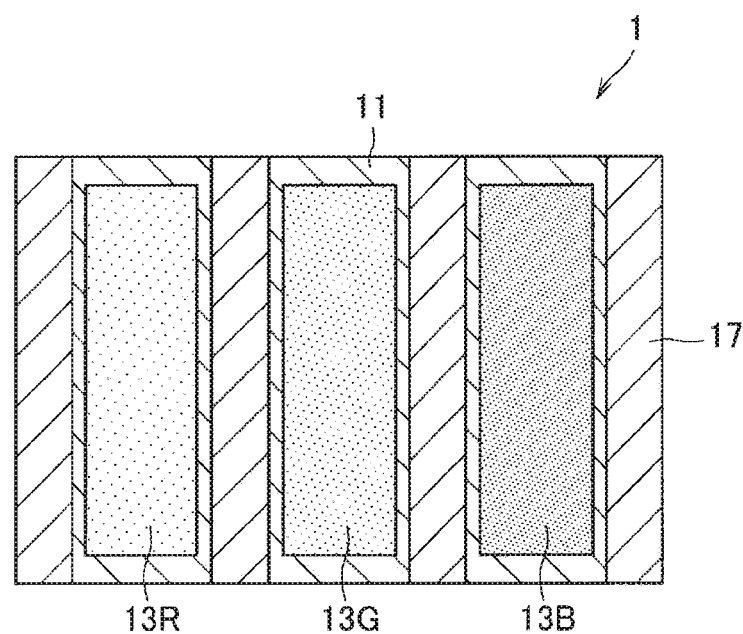
FIG. 1B is a plan view schematically illustrating a plane configuration of the display apparatus according to the same configuration.

FIG. 1A is a cross-sectional view schematically illustrating a stacked structure of a display apparatus according to the first configuration, and FIG. 1B is a plan view schematically illustrating a plane configuration of the display apparatus according to the same configuration.

As illustrated in FIG. 1A and FIG. 1B, a display apparatus 1 according to the first configuration includes a support substrate 11, a plurality of light-emitting elements 13R, 13G, and 13B provided on the support substrate 11 (also collectively called the light-emitting element 13), a light guiding/scattering layer 15 provided on the plurality of light-emitting elements 13R, 13G, and 13B, and reflection partition walls 17 that separate the light guiding/scattering layer 15 with respect to each of the light-emitting elements 13R, 13G, and 13B. The display apparatus 1 illustrated in FIG. 1A and FIG. 1B is a top-emitting display apparatus that extracts light emitted from the light-emitting element 13 via the light guiding/scattering layer 15.

The support substrate 11 is a support body that supports the plurality of light-emitting elements 13R, 13G, and 13B arranged on one surface. Furthermore, although not illustrated, on the support substrate 11, a control circuit that controls drive of the light-emitting element 13, a power circuit that supplies power to the light-emitting element 13, and a multilayer wiring layer including various wirings may be provided.

The light-emitting element 13 is, for example, a self-emitting organic electroluminescence element (organic EL element) including a first electrode, an organic light emitting layer provided on the first electrode, and a second electrode provided on the organic light emitting layer. The light-emitting element 13 sandwiches the organic light emitting layer between the first electrode and the second electrode, and emits light when an electric field is applied to the organic light emitting layer.

Specifically, in a case where an electric field is applied to the light-emitting element 13, a hole is injected into the organic light emitting layer from the first electrode, and an electron is injected into the organic light emitting layer from the second electrode. The injected hole and electron are recombined in the organic light emitting layer and form an exciton. When an organic light-emitting material contained in the organic light emitting layer is excited by the energy of the formed exciton, fluorescence or phosphorescence occurs.

Here, the light-emitting element 13 may emit light of a wavelength band corresponding to each color constituting pixels of the display apparatus 1. Specifically, the light-emitting element 13 may include an organic light emitting layer that emits light of a wavelength band corresponding to each color. Alternatively, the light-emitting element 13 may include an organic light emitting layer that emits white light, a color filter that converts the white light emitted from the organic light emitting layer into light of a wavelength band corresponding to each color, or the like. Note that each color constituting the pixels of the display apparatus 1 may use any combination insofar as it is a combination of publicly known colors constituting the pixels, e.g., three colors: red, green, and blue, four colors: red, green, blue, and white, or the like.

The light guiding/scattering layer 15 is transparent and scatters the light emitted from the light-emitting element 13. Specifically, the light guiding/scattering layer 15 includes a transparent material including therein a particle that scatters light, a crystal grain, a crystal grain boundary, a heterogeneous structure or a microstructure.

The light guiding/scattering layer 15 can efficiently extract, to the outside of the display apparatus 1, light that remains within each layer of the display apparatus 1 through reflection or total reflection at the interface of each layer of the display apparatus 1 by scattering the light emitted from the light-emitting element 13. A transparent material for forming the light guiding/scattering layer 15 is preferably a material having high light transmittance in order to increase the efficiency of light extraction from the light-emitting element 13, and may be, for example, a transparent material having a light transmittance of 90% or more.

The reflection partition walls 17 separate the light guiding/scattering layer 15 in a direction perpendicular to the surface of the support substrate 11 where the light-emitting element 13 is provided. Furthermore, the reflection partition walls 17 reflect the light emitted from the light-emitting element 13. Thus, the reflection partition walls 17 are capable of reflecting the light emitted from the light-emitting element 13 and the light scattered inside the light guiding/scattering layer 15. Therefore, the reflection partition walls 17 can increase light that reaches the outside of the display apparatus 1 from the light-emitting element 13 via the light guiding/scattering layer 15.

Furthermore, because the reflection partition walls 17 are provided to separate the light-emitting elements 13 from one another, it is possible to prevent the light emitted from each light-emitting element 13 from being mixed with the light of an adjacent light-emitting element 13. With the display apparatus 1, the light emitted from each light-emitting element 13 is scattered by the light guiding/scattering layer 15. However, the scattered light tends to spread isotropically and to be mixed with the light of an adjacent light-emitting element 13. Therefore, it is preferable that the display apparatus 1 include the reflection partition walls 17 to prevent the scattered light from being mixed with respect to an adjacent light-emitting element 13.

Note that, as illustrated in FIG. 1B, it is sufficient if the reflection partition wall 17 is provided at least between adjacent light-emitting elements 13. In other words, in order to prevent mixture of colors of adjacent light-emitting elements 13, it is sufficient if the reflection partition wall 17 is provided at least between light-emitting elements 13 which are close to an extent that color mixture occurs. However, in order to further increase the efficiency of light extraction from the light-emitting element 13, it is preferable that the reflection partition wall 17 be provided to surround the circumference of the light-emitting element 13.

The reflection partition wall 17 may include, for example, a semiconductor material having metallic luster or a metal material to reflect the light emitted from the light-emitting element 13. Furthermore, the reflection partition wall 17 may include a dichroic mirror including a dielectric multi-layer film on the surface to reflect the light emitted from the light-emitting element 13. Furthermore, the reflection partition wall 17 may include a diffraction grating including a micro irregular structure on the surface to reflect the light emitted from the light-emitting element 13. Moreover, the reflection partition wall 17 may include a dielectric material having a refractive index smaller than the refractive index of the transparent material constituting the light guiding/scattering layer 15 to totally reflect part of the light incident on the reflection partition wall 17 from the light guiding/scattering layer 15.

As described above, with the display apparatus 1 according to the first configuration, it is possible to increase the efficiency of light extraction from each light-emitting element 13 and prevent the light emitted from each light-emitting element 13 from being mixed. Furthermore, the display apparatus 1 can drive each light-emitting element 13 with low current density because the efficiency of light extraction from each light-emitting element 13 can be increased. Accordingly, the display apparatus 1 is capable of drive with lower power consumption and longer lifetime because each light-emitting element 13 can be driven at a low load.

1.2. Second Configuration

Figure 2A:
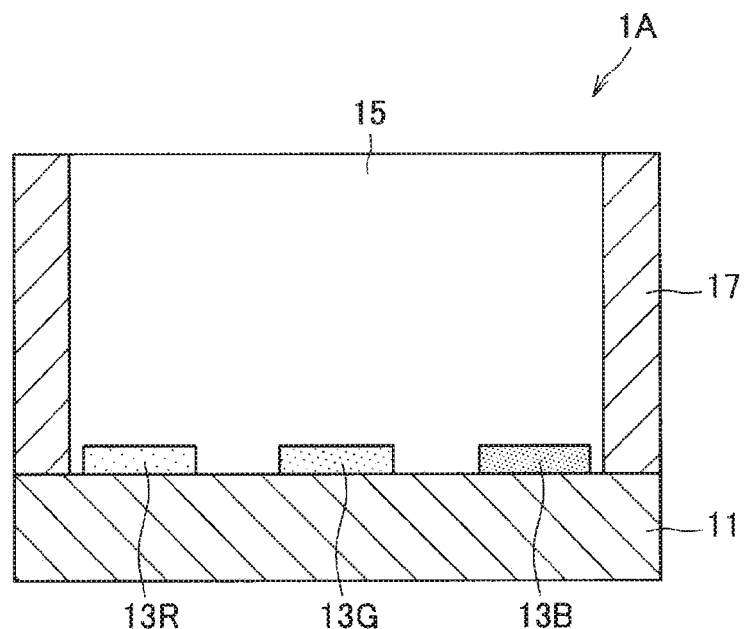
FIG. 2A is a cross-sectional view schematically illustrating a stacked structure of a display apparatus according to a second configuration.

Next, a display apparatus according to a second configuration is described with reference to FIG. 2A and FIG. 2B. FIG. 2A is a cross-sectional view schematically illustrating a stacked structure of a display apparatus according to the second configuration, and FIG. 2B is a plan view schematically illustrating a plane configuration of the display apparatus according to the same configuration.

Figure 2B:
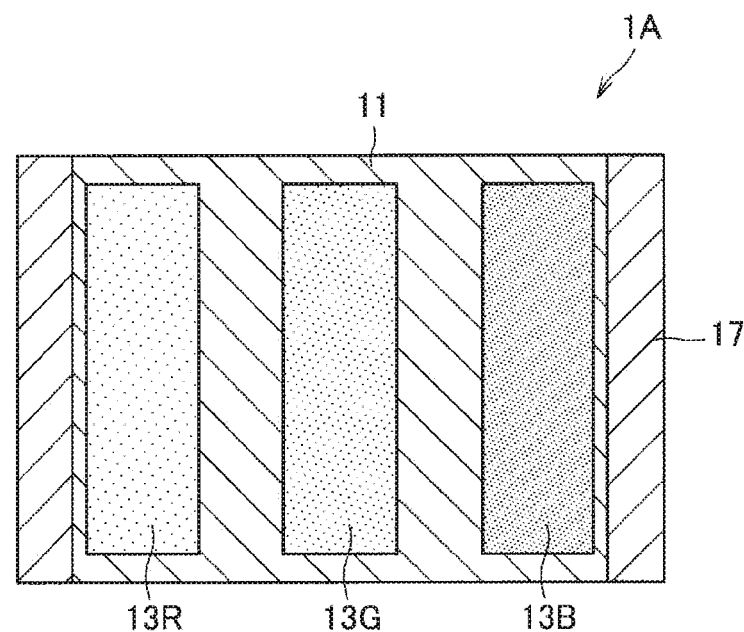
FIG. 2B is a plan view schematically illustrating a plane configuration of the display apparatus according to the same configuration.

As illustrated in FIG. 2A and FIG. 2B, a display apparatus 1A according to the second configuration includes a support substrate 11, a plurality of light-emitting elements 13R, 13G, and 13B provided on the support substrate 11 (also collectively called the light-emitting element 13), a light guiding/scattering layer 15 provided on the plurality of light-emitting elements 13R, 13G, and 13B, and reflection partition walls 17 that separate the light guiding/scattering layer 15 with respect to each pixel including the light-emitting elements 13R, 13G, and 13B.

In other words, the display apparatus 1A according to the second configuration differs from the display apparatus 1 according to the first configuration in that the light guiding/scattering layer 15 is separated by the reflection partition walls 17 with respect to each pixel. Note that, with the display apparatus 1A according to the second configuration, materials and functions of each configuration other than the position where the reflection partition walls 17 are provided are substantially similar to those of the display apparatus 1 according to the first configuration. Therefore, description is omitted here.

As illustrated in FIG. 2A and FIG. 2B, the display apparatus 1A includes the reflection partition wall 17 with respect to each pixel, and therefore it is possible to prevent occurrence of color mixture between pixels. Furthermore, with the display apparatus 1A, as compared with the display apparatus 1 according to the first configuration, the number of reflection partition walls 17 provided is reduced. Therefore, it is possible to simplify the structure of and a manufacturing process for the display apparatus 1A. Furthermore, with the display apparatus 1A, even in a case where pixel pitch of the display apparatus 1A is narrow, the reflection partition wall 17 can be formed easily.

With the display apparatus 1A, each pixel is controlled as a unit of display. Therefore, the color mixture between the light-emitting elements 13 included in the same pixel has small influences on a displayed image. Meanwhile, in a case where color mixture occurs between adjacent pixels, color blurring occurs around the pixel, resulting in a reduction in resolution. Therefore, influences on a displayed image are large. Accordingly, with the display apparatus 1A, color mixture between the light-emitting elements 13 included in the same pixel can be ignored and color mixture between pixels that has larger influences is prevented such that the structure of the display apparatus 1A can be simplified and the light extraction efficiency can be increased.

Note that, as illustrated in FIG. 2B, it is sufficient if the reflection partition walls 17 are at least provided between pixels that are close to an extent that color mixture occurs. However, in order to further increase the efficiency of light extraction from the light-emitting element 13, it is more preferable that the reflection partition walls 17 be provided to surround the circumference of the pixel.

2. Detailed Configuration of the Display Apparatus

Next, a detailed configuration of a display apparatus according to an embodiment of the present disclosure is described with reference to FIGS. 3A, 3B, 4, 5, 6A, and 6B in first to fourth specific examples.

2.1. First Specific Example

Figure 3A:
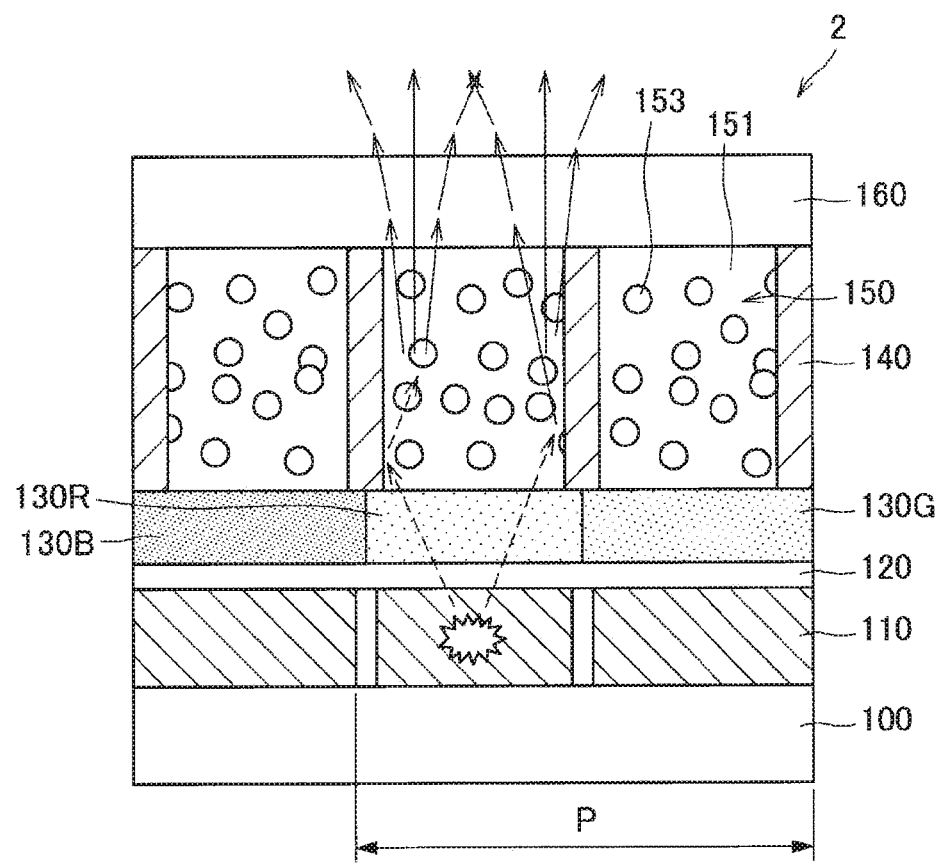
FIG. 3A is a cross-sectional view schematically illustrating a stacked structure of a display apparatus according to a first specific example.

First, a display apparatus according to the first specific example is described with reference to FIG. 3A and FIG. 3B. FIG. 3A is a cross-sectional view schematically illustrating a stacked structure of the display apparatus according to the first specific example, and FIG. 3B is a plan view schematically illustrating a plane configuration of the display apparatus according to the same specific example.

Figure 3B:
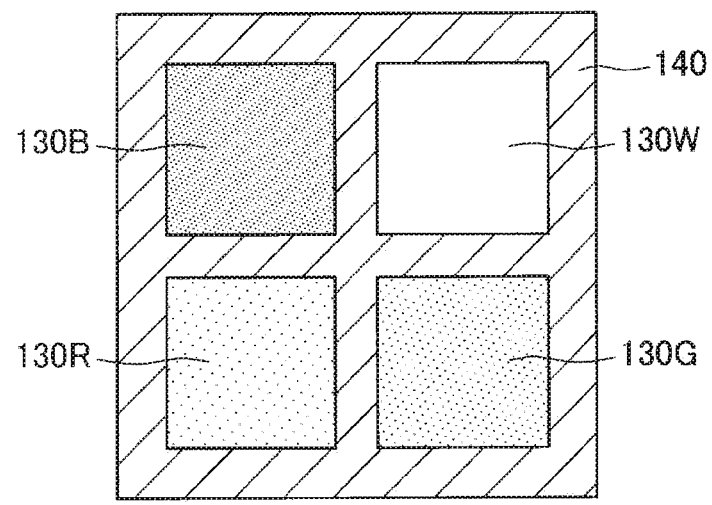
FIG. 3B is a plan view schematically illustrating a plane configuration of the display apparatus according to the same specific example.

As illustrated in FIG. 3A and FIG. 3B, the display apparatus 2 according to the first specific example includes a support substrate 100, a plurality of light-emitting elements 110 provided on the support substrate 100, a protective layer 120 provided on the plurality of light-emitting elements 110, color filters 130R, 130G, 130B, and 130W provided on the protective layer 120 (also collectively called the color filter layer 130), a light guiding/scattering layer 150 provided on the color filter layer 130 and including a transparent material 151 and a scattering body 153, a reflection partition wall 140 that separates the light guiding/scattering layer 150, and an opposite substrate 160 provided on the light guiding/scattering layer 150. The display apparatus 2 illustrated in FIG. 3A and FIG. 3B is a top-emitting display apparatus that extracts light emitted from the light-emitting element 110 via the opposite substrate 160.

The support substrate 100 is a support body that supports the plurality of light-emitting elements 110 arranged on one surface. Furthermore, although not illustrated, the support substrate 100 may include a control circuit that controls drive of each light-emitting element 110, a power circuit that supplies power to each light-emitting element 110, and a multilayer wiring layer including various wirings.

The support substrate 100 can include a publicly known material, e.g., a semiconductor substrate such as single-crystal, polycrystalline, or amorphous silicon (Si); a glass substrate, e.g., quartz glass, high strain point glass, soda glass (mixture of $Na_2O$, CaO, and $SiO_2$), borosilicate glass (mixture of $Na_2O$, $B_2O_3$, and $SiO_2$), forsterite ($Mg_2SiO_4$), or lead glass (mixture of $Na_2O$, PbO, and $SiO_2$); or an organic resin substrate, e.g., polymethyl methacrylate (PMMA), polyvinylalcohol (PVA), polyvinylphenol (PVP), polyethersulfone (PES), polyimide, polycarbonate, or polyethylene terephthalate (PET), or the like. Furthermore, a multilayer wiring layer including a plurality of insulation layers may be provided on the support substrate 100.

The display apparatus 2 is a top-emitting display apparatus. Therefore, the support substrate 100 may be either a transparent substrate or a non-transparent substrate, or may be a semiconductor substrate, e.g., a single-crystal, polycrystalline, or amorphous silicon (Si) substrate, which is easy to micro-process. Furthermore, in a case where the first electrode of the light-emitting element 110 described below is not formed as a light reflection electrode, it is preferable that a reflection electrode or a reflection layer be provided on the support substrate 100 side of the light-emitting element 110 in order to reflect the light emitted to the support substrate 100 side from the light-emitting element 110.

The light-emitting element 110 is, for example, a self-emitting organic electroluminescence element (organic EL element) including a first electrode, an organic light emitting layer provided on the first electrode, and a second electrode provided on the organic light emitting layer. The light-emitting element 110 emits light when an electric field is applied to the organic light emitting layer sandwiched between the first electrode and the second electrode.

Note that the display apparatus 2 includes the color filter layer 130 including the color filters 130R, 130G, and 130B corresponding to respective colors constituting the pixels. Therefore, it is sufficient that the light-emitting element 110 is an organic EL element that emits white light. In such a case, regarding each light-emitting element 110, when the first electrodes or second electrodes are formed separately from each other, the organic light emitting layers can continuously be formed commonly without being separated from each other. Therefore the manufacturing process can be simplified.

The first electrode is provided for each light-emitting element 110 and functions as an anode of the light-emitting element 110. Since the display apparatus 2 is a top-emitting display apparatus, it is preferable that the first electrode be formed of a material having high light reflectivity as a light reflection electrode that reflects the light emitted from the organic light emitting layer.

For example, the first electrode may include metal alone or alloy having high work function, e.g., platinum (Pt), gold (Au), silver (Ag), chromium (Cr), tungsten (W), nickel (Ni), copper (Cu), iron (Fe), cobalt (Co), tantalum (Ta), or the like. Furthermore, the first electrode may be formed as an electrode stack including a dielectric multilayer film or a thin film having high light-reflective property, e.g., aluminium, and thereon a transparent conductive material, e.g., indium zinc oxide (IZO), or an indium tin oxide (ITO).

The organic light emitting layer is, for example, formed as a multilayer structure including the first electrode and thereon a plurality of functional layers. Specifically, the organic light emitting layer may include a multilayer structure in which a hole injection layer, a hole transport layer, a light-emitting layer, an electron transport layer, and an electron injection layer are stacked in order from the first electrode side. Furthermore, the organic light emitting layer may include a so-called tandem structure in which light-emitting layers are connected via a charge generation layer or an intermediate electrode.

The hole injection layer is a layer that includes a hole injection material and increases the efficiency of injection of a hole from the first electrode. As the hole injection material, those publicly known may be used. Examples include triphenylamine-containing polyetherketone (TPAPEK), 4-isopropyl-4'-methyldiphenyliodonium tetrakis (pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4'4"-tris(n,n-diphenylamino)triphenylamine (TDATA), 4,4',4"-tris(N,N-2-naphthylphenylamino)triphenylamine (2-TNATA), or the like.

The hole transport layer is a layer that includes a hole transport material and increases the efficiency of transport of a hole from the first electrode. As the hole transport material, those publicly known may be used. For example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, or stilbene, derivatives thereof, or the like may be used.

More specifically, as the hole transport material, α-naphthylphenyl phenylenediamine (α-NPD), porphyrin, metallotetraphenylporphyrin, metallonaphthalocyanine, hexacyanoazatriphenylene (HAT), 7,7,8,8-tetracyanoquinodimethane (TCNQ), 7,7,8,8-tetracyano-2,3,5,6-tetrafluoroquinodimethane (F4-TCNQ), tetracyano4,4,4-tris(3-methylphenylphenylamino)triphenylamine, N,N,N',N'-tetrakis (p-tolyl) p-phenylenediamine, N,N,N',N'-tetraphenyl-4,4'-diaminobiphenyl, N-phenylcarbazole, or 4-di-p-tolylaminostilbene, or the like may be used.

The light-emitting layer is a layer that includes a hole transport material and an electron transport material, which are host materials, or at least one or more charge transport materials of both charge transport materials, and a fluorescent or phosphorescent organic light-emitting material, which is a dopant material, and converts electric energy into light energy.

As the host material, a publicly known charge transport material may be used. For example, a styryl derivative, an anthracene derivative, a naphthacene derivative, a carbazole derivative, an aromatic amine derivative, a phenanthroline derivative, a triazole derivative, a quinolinolato-based metal complex, a phenanthroline derivative, or the like may be used.

Furthermore, as the dopant material (organic light-emitting material), publicly known fluorescent material and phosphorescent material may be used. As the publicly known fluorescent material, for example, a pigment material, e.g., a styrylbenzene-based pigment, an oxazole-based pigment, a perylene-based pigment, a coumarin-based pigment, and an acridine-based pigment; a polyaromatic hydrocarbon-based material, e.g., an anthracene derivative, a naphthacene derivative, a pentacene derivative, and a chrysene derivative, a pyrromethene skeleton material, a quinacridone-based derivative, a cyanomethylenepyran-based derivative, a benzothiazole-based derivative, a benzoimidazole-based derivative, a metal-chelated oxynoid compound, or the like may be used. Furthermore, as the publicly known phosphorescent material, for example, an organic metal complex including at least one metal selected from the group consisting of ruthenium (Ru), rhodium (Rh), palladium (Pd), silver (Ag), rhenium (Re), osmium (Os), iridium (Ir), platinum (Pt), and gold (Au) may be used. Specifically, as the phosphorescent material, complexes of Ir(ppy)$_3$ having a noble metal element, e.g., Ir or the like, as a central metal, complexes of Ir(bt)$_2$.acac$_3$ or the like, and complexes of PtOEt$_3$ or the like may be used.

The electron transport layer is a layer that includes the electron transport material and increases the efficiency of injection of an electron from the second electrode.

As the electron transport material, those publicly known may be used. For example, tris(8-quinolinolato)aluminum (Alq$_3$), a compound having a nitrogen-containing aromatic ring, or the like may be used. More specifically, as the electron transport material, aforementioned tris(8-quinolinolato)aluminium (Alq$_3$), 2,9-dimethyl-4,7-diphenyl-1,10-phenanthroline (BCP), or bathophenanthroline (Bphen) may be used. Note that the electron transport layer may include a plurality of layers. In a case where the electron transport layer includes a plurality of layers, the electron transport layer may further include a layer doped with an alkali metal element or alkali earth metal element.

The electron injection layer is a layer that increases the efficiency of injection of an electron from the second electrode. The electron injection layer may include those publicly known, and may include, for example, lithium fluoride (LiF), sodium chloride (NaCl), cesium fluoride (CsF), lithium oxide (Li$_2$O), barium oxide (BaO), or the like.

The second electrode is formed across the plurality of light-emitting elements 110 on the organic light emitting layer and functions as a cathode of the light-emitting elements 110. The display apparatus 2 is top-emitting. Therefore, it is preferable that the second electrode include a material having high light transmittance and be formed as a transparent electrode that transmits the light emitted from the organic light emitting layer.

For example, the second electrode may include metal, alloy, or the like having a small work function, e.g., aluminium (Al), silver (Ag), magnesium (Mg), calcium (Ca), sodium (Na), strontium (Sr), alloy of alkali metal and silver, alloy of alkaline earth metal and silver, alloy of magnesium and calcium, or alloy of aluminium and lithium. Furthermore, the second electrode may include a transparent conductive material, e.g., indium zinc oxide (IZO), or indium tin oxide (ITO), and may be formed as an electrode stack including a layer including a material having a small work function described above and a layer including a transparent conductive material, e.g., indium zinc oxide (IZO), or indium tin oxide (ITO).

The protective layer 120 is provided on each light-emitting element 110 and protects each light-emitting element 110 against external environments. Specifically, the protective layer 120 prevents entry of water and oxygen into the organic light emitting layer contained in the light-emitting element 110. It is preferable that the protective layer 120 include a material having a high light transmission property and having a high gas barrier property. For example, it is preferable that the protective layer 120 include silicon oxide (SiO$_x$), silicon nitride (SiN$_x$), or aluminum oxide (AlO$_x$). Furthermore, the protective layer 120 may be formed as a stacked film of the aforementioned material or the like for the purpose of increased protection performance, e.g., gas barrier property, or adjustment of the refractive index.

The color filters 130R, 130G, 130B, and 130W are provided on the protective layer 120 to correspond to respective colors constituting the pixel (a range indicated as region P in FIG. 3A) of the display apparatus 2. In other words, the display apparatus 2 is a display apparatus of a so-called on-chip color filter (OCCF) type in which the color filter layer 130 is formed on the support substrate 100 where the light-emitting element 110 is formed.

Specifically, the color filters 130R, 130G, 130B, and 130W are arranged in regions obtained by equal division of a pixel region and convert the light emitted from each light-emitting element 110 into light having a wavelength band corresponding to each color. For example, the color filters 130R, 130G, 130B, and 130W may be a red filter, a green filter, a blue filter, and a white filter, respectively. Note that in a case where the light-emitting element 110 is a light-emitting element that emits white light, a white filter may not be provided. The color filters 130R, 130G, 130B, and 130W may include, for example, resin including pigment or dye.

Furthermore, the display apparatus 2 may further include a black matrix that defines each pixel in addition to the color filters 130R, 130G, 130B, and 130W. The black matrix includes a material having high light shielding property, e.g., chromium (Cr), or graphite, and can enhance contrast of the display apparatus 2 by shielding unnecessary light or the like, which is generated by reflection of the wires or the like, between pixels.

The light guiding/scattering layer 150 includes the transparent material 151 in which the scattering body 153 is dispersed, and is provided on the color filter layer 130. The light guiding/scattering layer 150 is a layer that scatters the light that has passed through the color filter layer 130, and guides the light to the opposite substrate 160. For example, the light guiding/scattering layer 150 may be configured such that the scattering body 153 that scatters the light is dispersed in the transparent material 151, which is an organic resin having a high light transmission property.

The transparent material 151 is an organic resin having high light transmission property. Specifically, the transparent material 151 may be an organic resin having a light transmittance of 90% or more. The transparent material 151 may, for example, be epoxy resin, acrylic resin, methacrylic resin, silicone resin, vinyl resin, urethane resin, cellulose resin, or the like. Note that in a case where the transparent material 151 is a photocurable or heat-curable resin, when the scattering body 153 is dispersed in the transparent material 151 in a pre-cured liquid form, the light guiding/scattering layer 150 can easily be formed by spin coating method using a precursor liquid.

The scattering body 153 is a micro solid that less absorbs light. Specifically, the scattering body 153 may be a plurality of transparent particles having a refractive index higher than the refractive index of the transparent material 151. The scattering body 153 may be, for example, resin piece including an organic resin, glass bead, an inorganic oxide filler, or the like, and may preferably be a filler including an inorganic oxide having a high refractive index. Examples of the inorganic oxide having a high refractive index include zirconium oxide (ZrO2), barium titanate (BaTiO2), titanium oxide (TiO2), zinc oxide (ZnOx), yttrium oxide (Y2O3), aluminium oxide (Al2O3), and the like.

The scattering body 153 may be formed through proper selection of a material having a refractive index higher than the refractive index of the transparent material 151 from among the aforementioned materials. However, it is preferable that the scattering body 153 be a filler including an inorganic oxide having a high refractive index. The aforementioned inorganic oxide filler having a high refractive index has a higher refractive index than that of a general organic resin or glass. Therefore, the use of the inorganic oxide filler for the scattering body 153 enables more efficient scattering of the light that passes through the light guiding/scattering layer 150. Furthermore, the aforementioned inorganic oxide filler having a high refractive index has a strength larger than that of a general organic resin or glass. Therefore, the use of the inorganic oxide filler for the scattering body 153 enables a further increase in mechanical strength of the light guiding/scattering layer 150.

The scattering body 153 may have an average particle size of, for example, 0.2 µm or more and 10 µm or less, preferably 0.4 µm or more and 2 µm less. In a case where the average particle size of the scattering body 153 is less than the aforementioned range, the light emitted from the light-emitting element 110 becomes less likely to be scattered, and the light extraction efficiency is not increased unfavorably. Furthermore, in a case where the average particle size of the scattering body 153 exceeds the aforementioned range, the light emitted from the light-emitting element 110 is scattered excessively such that the light transmission property of the light guiding/scattering layer 150 is reduced and the light extraction efficiency is reduced unfavorably.

Note that the average particle size of the scattering body 153 is, for example, a numerical average value of an area circle equivalent diameter in a case where the scattering body 153 is assumed to be a true sphere, and can be calculated such that an image obtained when the scattering body 153 is observed by scanning electron microscope (SEM) or the like is analyzed to measure the area circle equivalent diameter. Furthermore, the shape of the scattering body 153 is not particularly limited, but may, for example, be a variety of shapes, e.g., a spherical shape, an oval sphere shape, a flat plate shape, or a polygonal cube shape.

Here, the content of the scattering body 153 with respect to the transparent material 151 may be, in a solid content mass ratio, 2 mass % or more and 50 mass % or more, preferably 5 mass % or more and 30 mass % or less. In a case where the content of the scattering body 153 is less than the aforementioned range, the light emitted from the light-emitting element 110 becomes less likely to be scattered, and the light extraction efficiency is not increased unfavorably. Furthermore, in a case where the content of the scattering body 153 exceeds the aforementioned range, the light emitted from the light-emitting element 110 is scattered excessively such that the light transmission property of the light guiding/scattering layer 150 is reduced and the light extraction efficiency is reduced unfavorably.

Note that as the scattering body 153, a combination of kinds of micro solid which are at least different in material, shape, or average particle size may be used.

The reflection partition wall 140 is provided on the color filter layer 130 and separates the light guiding/scattering layer 150 in a direction perpendicular to the substrate surface of the support substrate 100. Specifically, the reflection partition wall 140 separates portions of the light guiding/scattering layer 150 corresponding to each of regions where the color filters 130R, 130G, 130B, and 130W corresponding to respective colors are provided. Furthermore, the reflection partition wall 140 may be formed to surround the circumference of the regions where the color filters 130R, 130G, 130B, and 130W corresponding to respective colors are provided.

The reflection partition wall 140 may, for example, include a semiconductor material, e.g., silicon (Si), or a metal material, e.g., aluminium (Al), or titanium (Ti). In such a case, the reflection partition wall 140 can unfailingly reflect the light emitted from the light-emitting element 110. Furthermore, the reflection partition wall 140 may include a dielectric material having a refractive index smaller than the refractive index of the transparent material 151. In such a case, the reflection partition wall 140 can totally reflect the light incident onto reflection partition wall 140 from the transparent material 151.

Moreover, the reflection partition wall 140 may include a reflection structure, e.g., a dichroic mirror including a dielectric multilayer film, or a diffraction grating including a micro irregular structure, on the surface so as to reflect the light emitted from the light-emitting element 110.

The opposite substrate 160 is provided on the light guiding/scattering layer 150. Specifically, the opposite substrate 160 is formed by being bonded to the support substrate 100 on which layers up to the light guiding/scattering layer 150 have been stacked, via a sealing resin, e.g., epoxy resin. Thus, the opposite substrate 160 can protect the light-emitting element 110, the color filter layer 130, and the light guiding/scattering layer 150 from external environments and increase the mechanical strength of the display apparatus 2.

The opposite substrate 160 includes a material having a high light transmission property and a high mechanical strength. For example, the opposite substrate 160 may include a glass substrate, e.g., quartz glass, high strain point glass, soda glass (mixture of $Na_2O$, $CaO$, and $SiO_2$), borosilicate glass (mixture of $Na_2O$, $B_2O_3$, and $SiO_2$), forsterite ($Mg_2SiO_4$), or lead glass (mixture of $Na_2O$, PbO, and $SiO_2$); an organic resin substrate, e.g., polymethylmethacrylate (PMMA), polyvinylalcohol (PVA), polyvinylphenol (PVP), polyethersulfone (PES), polyimide, polycarbonate, or polyethylene terephthalate (PET), or the like. Note that the opposite substrate 160 may include the same material as that of the support substrate 100 or may include a different material.

With the display apparatus 2 according to such a first specific example, the light that has been emitted from the light-emitting element 110 and has passed through any of the color filters 130R, 130G, 130B, and 130W can be scattered by the light guiding/scattering layer 150 and guided to the opposite substrate 160. Thus, with the display apparatus 2, the light that remains inside the display apparatus 2 through reflection or total reflection at the interface of each layer can efficiently be extracted to the outside of the display apparatus 2. Furthermore, with the display apparatus 2, it is possible to prevent the light scattered by the light guiding/scattering layer 150 from being mixed with the adjacent light-emitting element 110 or the like.

2.2. Second Specific Example

Figure 4:
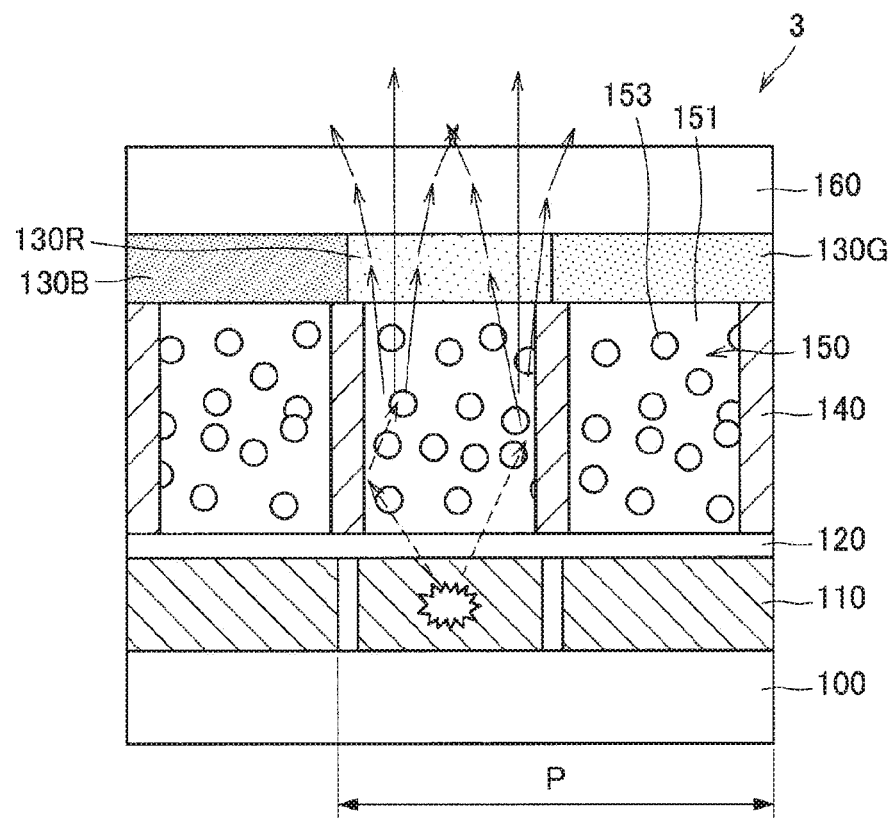
FIG. 4 is a cross-sectional view schematically illustrating a stacked structure of a display apparatus according to a second specific example.

Next, a display apparatus according to the second specific example is described with reference to FIG. 4. FIG. 4 is a cross-sectional view schematically illustrating a stacked structure of a display apparatus according to the second specific example.

As illustrated in FIG. 4, a display apparatus 3 according to the second specific example differs from the display apparatus 2 according to the first specific example in that the color filter layer 130 (i.e., color filters 130R, 130G, 130B, and 130W (not illustrated)) is provided on the light guiding/scattering layer 150. Note that because other configurations of the display apparatus 3 are substantially similar to those of the display apparatus 2 according to the first specific example, description is omitted here.

The display apparatus 3 according to such a second specific example may be formed such that the color filter layer 130 is formed on the opposite substrate 160 and then the support substrate 100 and the opposite substrate 160 are bonded together such that the color filter layer 130 opposes the light guiding/scattering layer 150. In other words, the display apparatus 3 according to the second specific example is a so-called opposing color filter (opposing CF) display apparatus.

With the display apparatus 3 according to the second specific example, a distance between the light-emitting element 110 and the light guiding/scattering layer 150 is reduced such that the amount of light entering the light guiding/scattering layer 150 from the light-emitting element 110 can be increased and the efficiency of light extraction from the light-emitting element 110 can be further increased. Furthermore, with the display apparatus 3 according to the second specific example, when the distance between the light-emitting element 110 and the light guiding/scattering layer 150 is reduced, it is possible to further suppress occurrence of color mixture of the light between adjacent light-emitting elements 110.

2.3. Third Specific Example

Figure 5:
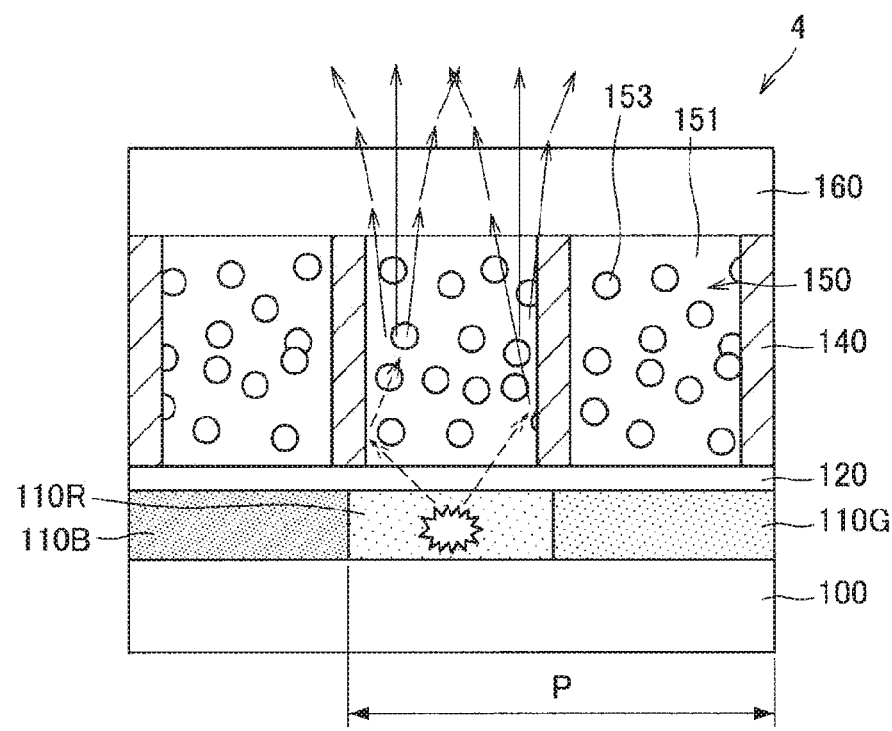
FIG. 5 is a cross-sectional view schematically illustrating a stacked structure of a display apparatus according to a third specific example.

Next, a display apparatus according to the third specific example is described with reference to FIG. 5. FIG. 5 is a cross-sectional view schematically illustrating a stacked structure of a display apparatus according to the third specific example.

As illustrated in FIG. 5, a display apparatus 4 according to the third specific example differs from the display apparatus 2 according to the first specific example in that the color filter layer 130 (i.e., color filters 130R, 130G, 130B, and 130W (not illustrated)) is not provided, but light-emitting elements 110R, 110G, 110B, and 110W (not illustrated) that emit light having a wavelength band corresponding to respective colors constituting the pixel are provided.

Specifically, the display apparatus 4 may include the red light-emitting element 110R that emits red light, the green light-emitting element 110G that emits green light, the blue light-emitting element 110B that emits blue light, and the white light-emitting element 110W (not illustrated) that emits white light. Note that because other configurations of the display apparatus 4 are substantially similar to those of the display apparatus 2 according to the first specific example, description is omitted here.

Here, the red light-emitting element 110R may be formed using, for example, a layer obtained when 2,6-bis[(4'-methoxydiphenylamine) styryl]-1,5-dicyanonaphthalene (BSN) is mixed with 4,4-bis(2, 2-diphenylbinin) biphenyl (DPVBi) in an amount of 30 mass % as the light emitting layer. Furthermore, the green light-emitting element 110G may, for example, be formed when a layer obtained when coumarin 6 is mixed with the DPVBi in an amount of 5 mass % is used as the light-emitting layer. Moreover, the blue light-emitting element 110B may be formed when a layer obtained when 4,4'-bis[2-{4-(N,N-diphenylamino) phenyl}vinyl]biphenyl (DPAVBi) is mixed with the DPVBi in an amount of 2.5 mass % is used as the light-emitting layer. Furthermore, the red light-emitting element 110R, the green light-emitting element 110G, the blue light-emitting element 110B, and the white light-emitting element 110W can be formed using a publicly known fluorescent material or phosphorescent material other than the aforementioned materials.

With the display apparatus 4 according to the third specific example, when a distance between the light-emitting elements 110R, 110G, 110B, and 110W and the light guiding/scattering layer 150 is reduced, the amount of light that enters the light guiding/scattering layer 150 from the light-emitting elements 110R, 110G, 110B, and 110W can be increased. Therefore, it is possible to further increase the efficiency of light extraction from the light-emitting elements 110R, 110G, 110B, and 110W. Furthermore, with the display apparatus 4 according to the third specific example, when a distance between the light-emitting elements 110R, 110G, 110B, and 110W and the light guiding/scattering layer 150 is reduced, it is possible to further suppress occurrence of color mixture of light between the adjacent light-emitting elements 110R, 110G, 110B, and 110W. Moreover, with the display apparatus 4 according to the third specific example, the color filter layer 130 may be omitted to simplify the stacked structure of the display apparatus 4. Therefore, the manufacturing process for the display apparatus 4 can be simplified.

2.4. Fourth Specific Example

Figure 6A:
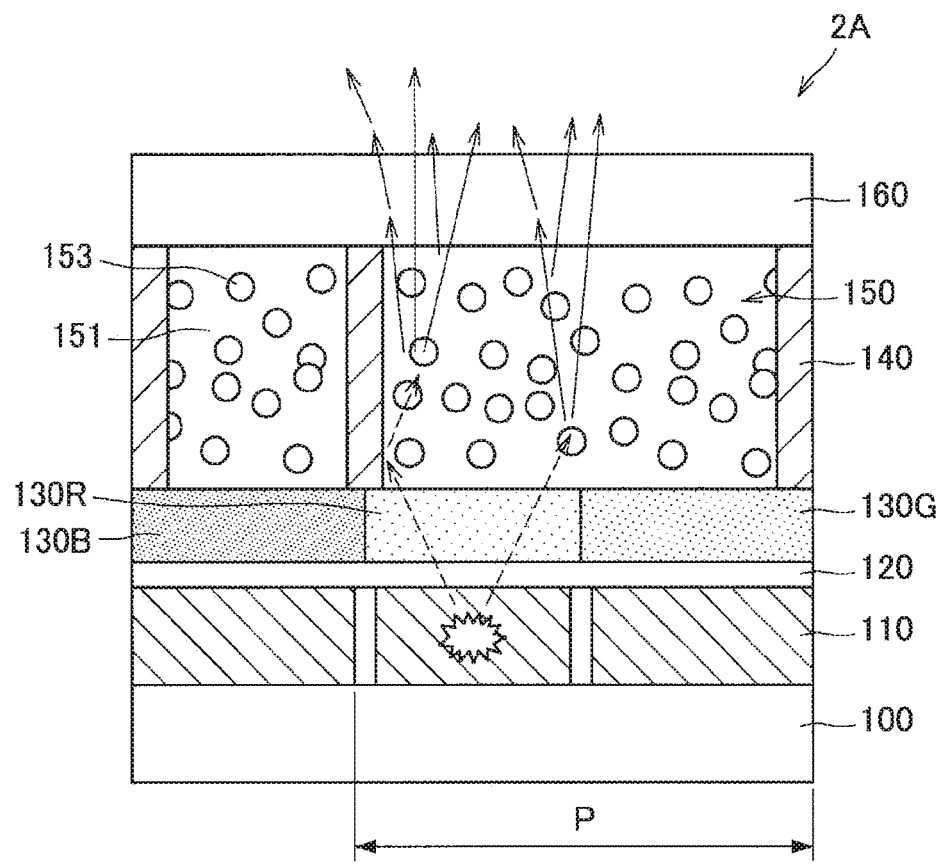
FIG. 6A is a cross-sectional view schematically illustrating a stacked structure of a display apparatus according to a fourth specific example.

Next, a display apparatus according to the fourth specific example is described with reference to FIG. 6A and FIG. 6B. FIG. 6A is a cross-sectional view schematically illustrating a stacked structure of the display apparatus according to the fourth specific example, and FIG. 6B is a plan view schematically illustrating a plane configuration of the display apparatus according to the same specific example.

Figure 6B:
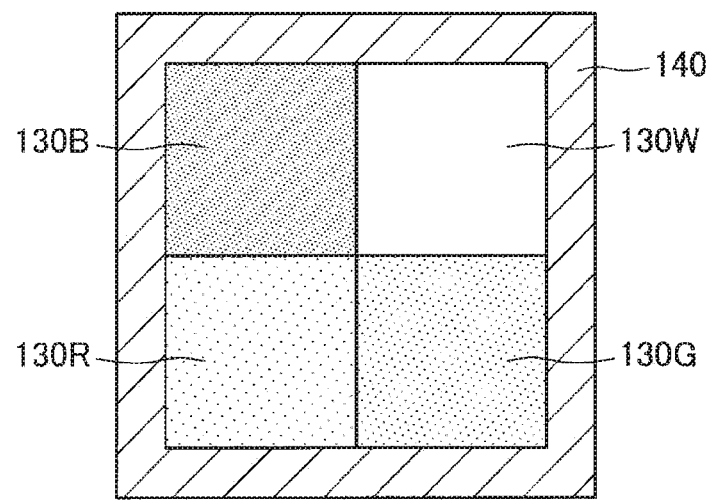
FIG. 6B is a plan view schematically illustrating a plane configuration of the display apparatus according to the same specific example.

As illustrated in FIG. 6A and FIG. 6B, the display apparatus 2A according to the fourth specific example differs from the display apparatus 2 according to the first specific example in that the reflection partition wall 140 is provided to separate the light guiding/scattering layer 150 with respect to each pixel.

Specifically, with the display apparatus 2A, the pixels include respective colors corresponding to the color filters 130R, 130G, 130B, and 130W, and each of regions where the color filters 130R, 130G, 130B, and 130W are provided functions as one pixel. Therefore, with the display apparatus 2A, the reflection partition wall 140 is formed to surround a region where the color filters 130R, 130G, 130B, and 130W are provided (a range indicated by region P in FIG. 6A). Note that because other configurations of the display apparatus 2A are substantially similar to those of the display apparatus 2 according to the first specific example, description is omitted here.

With the display apparatus 2A, the reflection partition wall 140 that separates the light guiding/scattering layer 150 is provided to surround the region constituting the pixel with respect to each pixel, and therefore it is possible to prevent occurrence of color mixture between the pixels. Furthermore, with the display apparatus 2A, as compared with the display apparatus 2 according to the first specific example, the number of reflection partition walls 140 to be provided can be reduced. Therefore, the structure of and the manufacturing process for the display apparatus 2A can be simplified. Furthermore, even in a case where the pixel pitch of the display apparatus 2A is narrow, the reflection partition wall 140 can easily be formed.

Note that with the display apparatus 2A according to the fourth specific example, an example of a display apparatus of an OCCF type in which the color filter layer 130 is provided on the protective layer 120 is indicated, but the present specific example is not limited to the above example. For example, as with the display apparatus 3 according to the second specific example, the display apparatus 2A may be a display apparatus of an opposing CF type in which the color filter layer 130 is provided below the opposite substrate 160. Furthermore, as with the display apparatus 4 according to the third specific example, the display apparatus 2A may be a display apparatus that does not include the color filter layer 130 such that each light-emitting element 110 emits light having a wavelength band corresponding to each color constituting the pixel.

2.5. Variation Example

Figure 7:
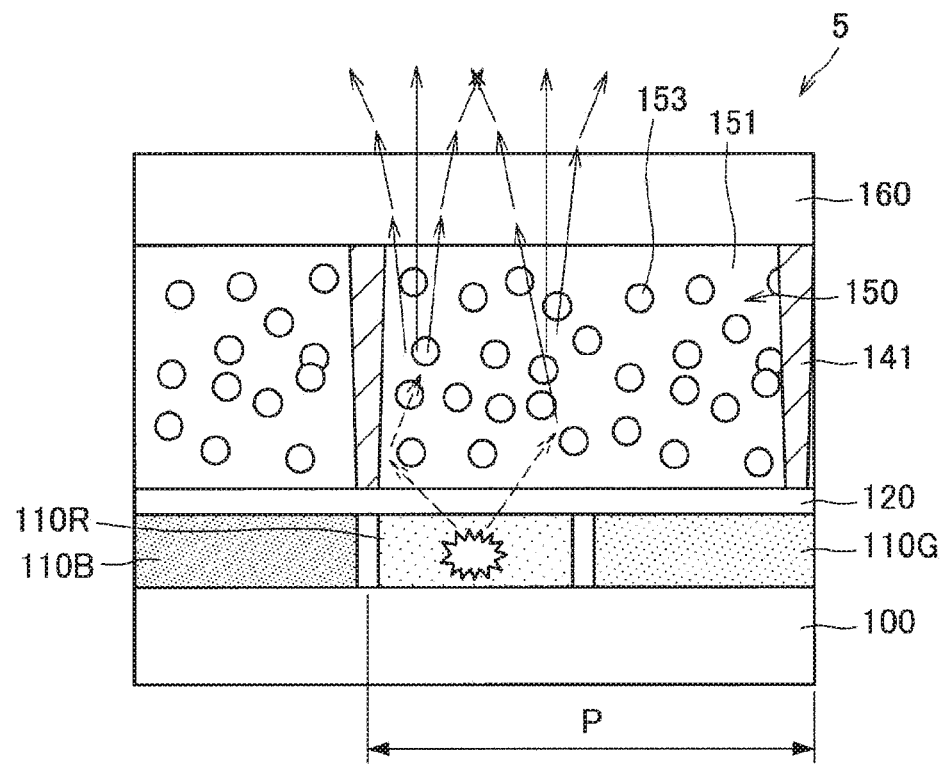
FIG. 7 is a cross-sectional view schematically illustrating a stacked structure of a display apparatus according to a variation example.
Figure 8:
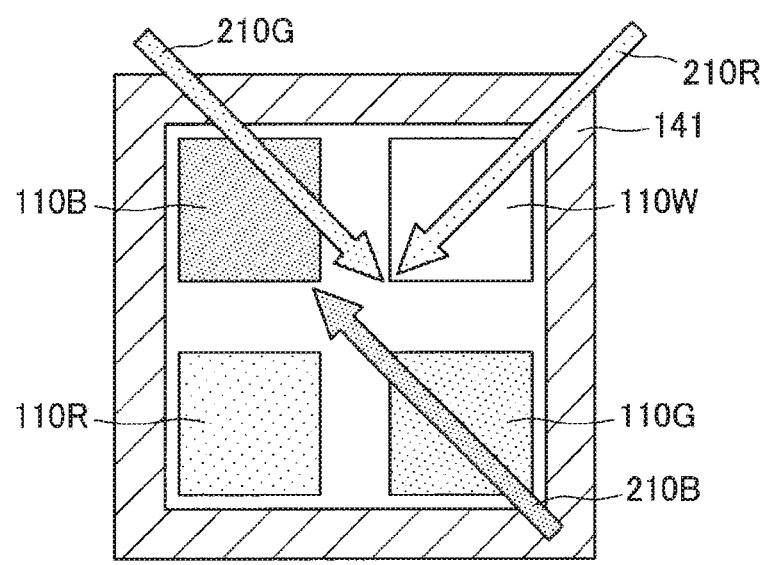
FIG. 8 is an explanatory view illustrating a deposition method for depositing an organic light emitting layer in the same variation example.
Figure 9:
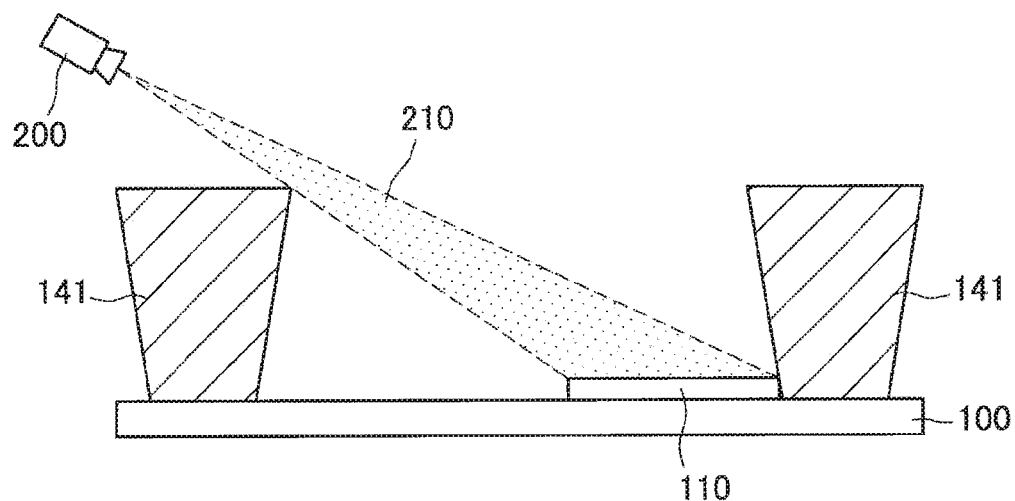
FIG. 9 is an explanatory view illustrating a deposition method for depositing an organic light emitting layer in the same variation example.

Next, a display apparatus according to the variation example is described with reference to FIG. 7 to FIG. 9. FIG. 7 is a cross-sectional view schematically illustrating a stacked structure of a display apparatus according to the variation example. FIG. 8 and FIG. 9 are explanatory views illustrating a deposition method for depositing the organic light emitting layer in the same variation example.

As illustrated in FIG. 7, the display apparatus 5 according to the present variation example differs from the display apparatuses according to the other specific examples in that the reflection partition wall 141 is formed to have a reverse-tapered shape in which the cross-sectional width in the stack direction increases toward the opposite substrate 160 side. Specifically, the reflection partition wall 141 can be formed to have a reverse-tapered shape having a large width on the opposite substrate 160 side and a small width on the support substrate 100 side by being processed by isotropic etching.

With such a configuration, the light emitted from the light-emitting element 110 (i.e., light-emitting elements 110R, 110G, and 110B) has a small incident angle when being incident onto the reflection partition wall 141. Accordingly, the light emitted from the light-emitting element 110 is reflected further in a direction of the inside of the light guiding/scattering layer 150. Thus, with the display apparatus 5, because the light emitted from the light-emitting element 110 is further scattered by the light guiding/scattering layer 150, it is possible to further increase the efficiency of light extraction from the light-emitting element 110.

Note that the taper angle of the reflection partition wall 141 may be any angle insofar as the reflection partition wall 141 has a reverse-tapered shape having a large width on the opposite substrate 160 side. However, for example, in a case where the absolute value of the taper angle of the reflection partition wall 141 exceeds 45°, the aperture degree of the display apparatus 5 is reduced unfavorably. Furthermore, in a case where the absolute value of the taper angle of the reflection partition wall 141 is less than 5°, it becomes difficult to obtain the effect of increasing the efficiency of light extraction from the light-emitting element 110 unfavorably.

Furthermore, as illustrated in FIG. 7, in a case where the display apparatus 5 according to the present variation example does not include the color filter layer 130, but includes the light-emitting elements 110R, 110G, 110B, and 110W (not illustrated) that emit light having a wavelength band corresponding to each color constituting the pixel, it is possible to form the light-emitting elements 110R, 110G, 110B, and 110W more efficiently.

Such an effect is described with reference to FIG. 8 and FIG. 9. FIG. 8 and FIG. 9 are explanatory views illustrating a deposition method for depositing the organic light emitting layer in the same variation example.

As illustrated in FIG. 8, the organic light emitting layer of the light-emitting element 110 can be deposited after the formation of the reflection partition wall 141. In such a case, the organic light emitting layer of the light-emitting element 110 may be deposited, for example, by oblique deposition that is performed from a diagonal direction of each pixel. Specifically, the organic light emitting layer of the light-emitting element 110 may be formed by oblique deposition from a direction of the center of the pixel along a diagonal line connecting a position where the organic light emitting layer is provided to the center of the pixel including the light-emitting element 110.

For example, the organic light emitting layer of the light-emitting element 110R may be formed by oblique deposition from a direction of arrow 210R, the organic light emitting layer of the light-emitting element 110G may be formed by oblique deposition from a direction of arrow 210G, and the organic light emitting layer of the light-emitting element 110B may be formed by oblique deposition from a direction of arrow 210B.

By such oblique deposition, as illustrated in FIG. 9, a deposition substance 210 shot from a deposition source 200 is blocked by a structure on a deposition surface and is not deposited in a region hidden behind the structure. Accordingly, with the display apparatus 5 according to the present variation example, because the deposition substance 210 is blocked by the pre-formed reflection partition wall 141, the deposition substance 210 is preferentially deposited in a region away from the reflection partition wall 141 along the deposition direction. Thus, even without the use of a mask or the like, it is possible to form the organic light emitting layer of each light-emitting element 110 in a corresponding region.

In particular, in a case where the reflection partition wall 141 has a reverse-tapered shape having a large width on a side away from the support substrate 100, there is a large region in which the deposition substance 210 is blocked behind the reflection partition wall 141 at the time of oblique deposition. Accordingly, with the display apparatus 5 according to the present variation example, even without using a mask or the like, it is possible to separately form each organic light emitting layer of the light-emitting element 110 more accurately.

As described above, with the display apparatus according to the present embodiment, it is possible to increase the efficiency of light extraction from the light-emitting element 110 by scattering the light emitted from the light-emitting element 110 using the light guiding/scattering layer 150. Furthermore, with the display apparatus according to the present embodiment, it is possible to increase the efficiency of light extraction from the light-emitting element 110 without occurrence of color mixture between adjacent pixels or light-emitting elements 110 by the reflection partition wall 140 that separates the light guiding/scattering layer 150. With such a display apparatus having increased light extraction efficiency, each light-emitting element 13 can be driven at low current density. Therefore, lower power consumption and longer lifetime driving is possible.

3. Example of Application of the Display Apparatus

Next, an example of application of the display apparatus according to the present embodiment is described with reference to FIG. 10 to FIG. 13. FIG. 10 to FIG. 13 are external appearance views illustrating an example of an electronic device to which the display apparatus according to the present embodiment can be applied.

Figure 10:
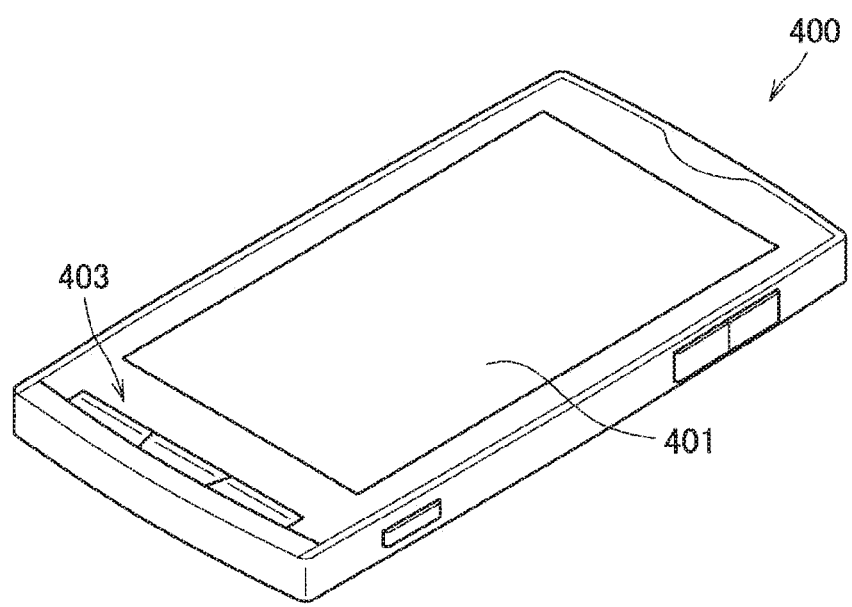
FIG. 10 is an external appearance view illustrating an example of an electronic device to which a display apparatus according to an embodiment of the present disclosure can be applied.

For example, the display apparatus according to the present embodiment can be applied to a display unit of an electronic device, e.g., a smartphone. Specifically, as illustrated in FIG. 10, a smartphone 400 includes a display unit 401 that displays a variety of information and an operation unit 403 including a button or the like that receives a user's operation input. Here, the display unit 401 may include the display apparatus according to the present embodiment.

Figure 11:
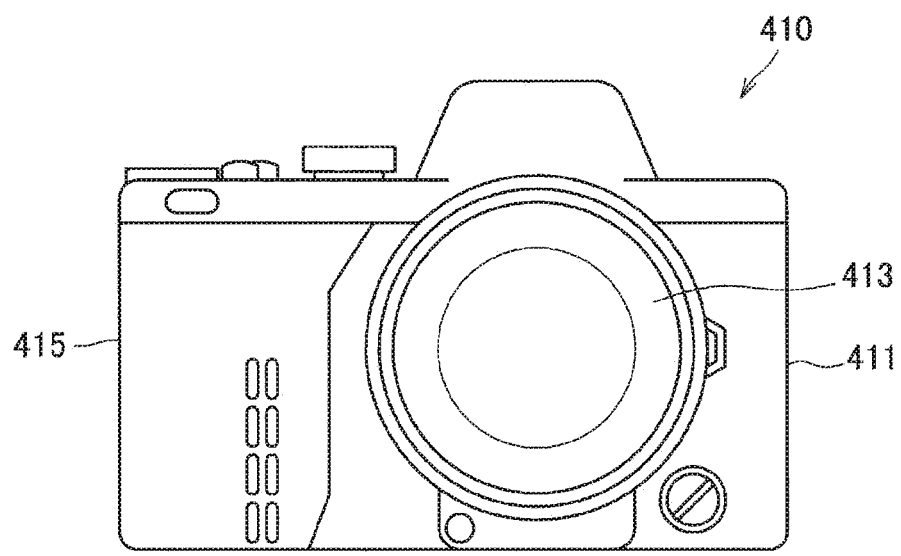
FIG. 11 is an external appearance view illustrating another example of an electronic device to which the display apparatus according to the same embodiment can be applied.
Figure 12:
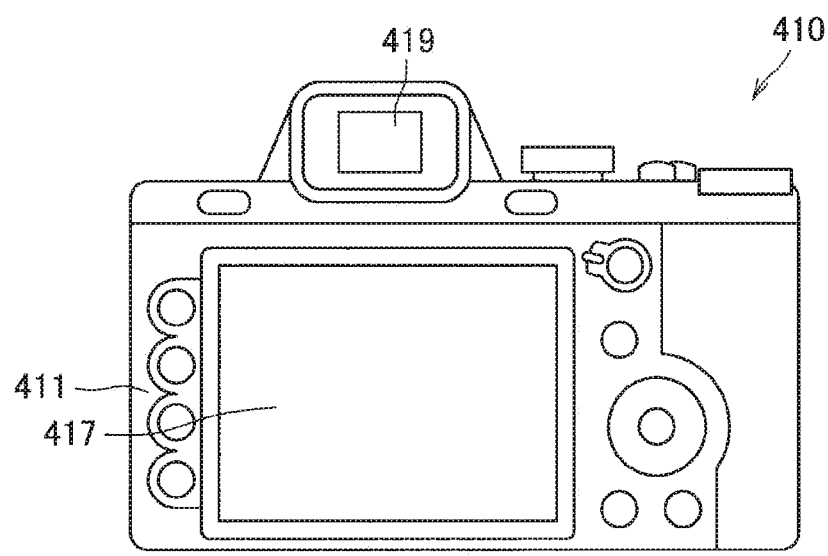
FIG. 12 is an external appearance view illustrating another example of an electronic device to which the display apparatus according to the same embodiment can be applied.

Furthermore, for example, the display apparatus according to the present embodiment can be applied to a display unit of an electronic device, e.g., a digital camera. Specifically, as illustrated in FIG. 11 and FIG. 12, a digital camera 410 includes a body unit (camera body) 411, a replaceable lens unit 413, a grip unit 415 gripped by a user during shooting, a monitor unit 417 that displays a variety of information, and an electronic view finder (EVF) 419 that displays a through image observed by the user during shooting. Note that FIG. 11 illustrates an external appearance obtained when the digital camera 410 is viewed from a front side (i.e., a subject side), and FIG. 12 illustrates an external appearance obtained when the digital camera 410 is viewed from a back side (i.e., a side where a person performs shooting). Here, the monitor unit 417 and the EVF 419 may include the display apparatus according to the present embodiment.

Figure 13:
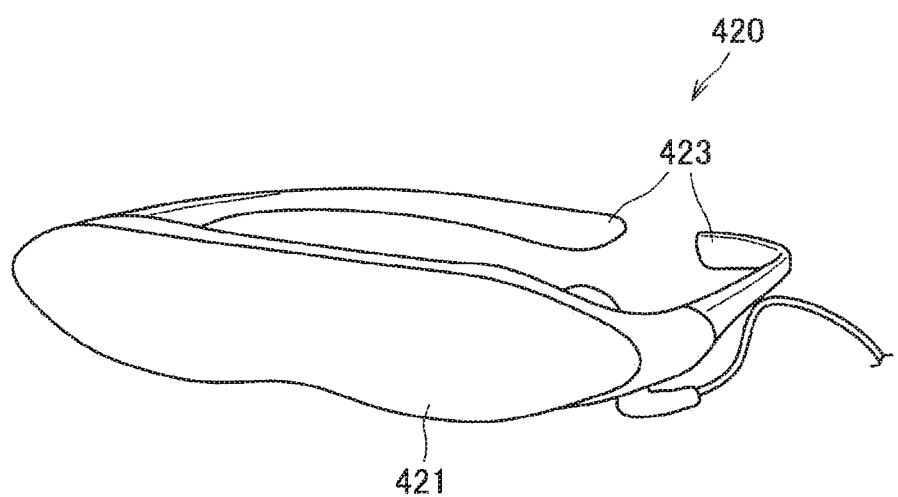
FIG. 13 is an external appearance view illustrating another example of an electronic device to which the display apparatus according to the same embodiment can be applied.

Furthermore, for example, the display apparatus according to the present embodiment can be applied to a display unit of an electronic device, e.g., a head mounted display (HMD). Specifically, as illustrated in FIG. 13, an HMD 420 includes an eyeglass-type display unit 421 that displays a variety of information and an ear hook unit 423 that is hooked on the ear of a user when worn. Here, the display unit 421 may include the display apparatus according to the present embodiment.

Note that the electronic device to which the display apparatus according to the present embodiment can be applied is not limited to the above examples. The display apparatus according to the present embodiment can be applied to a display unit of an electronic device of any field that performs display on the basis of an image signal input from the outside or an image signal generated internally. Examples of such an electronic device can include a television apparatus, an e-book, a personal digital assistant (PDA), a laptop personal computer, a video camera, a game device, or the like.

The preferred embodiment(s) of the present disclosure has/have been described above with reference to the accompanying drawings, whilst the technical scope of the present disclosure is not limited to the above examples. It is apparent that a person having normal knowledge in the technical field of the present disclosure may find various alterations and modifications within the scope of the technical idea stated in the claims, and it should be understood that they will naturally come under the technical scope of the present disclosure.

Furthermore, the effects described in this specification are merely illustrative or exemplified effects, and are not limitative. That is, with or in the place of the above effects, the technology according to the present disclosure may achieve other effects that are clear to those skilled in the art from the description of this specification.

Heretofore, description is given of the display apparatus using the organic EL element and the electronic device as an embodiment of the present disclosure. However, the present disclosure is not limited to the above examples. The display apparatus to which the present disclosure is directed may be any display apparatuses insofar as they are a display apparatus that can achieve color display, e.g., a liquid crystal display, a plasma display, an electronic paper, and the like. Also with such other display apparatuses, when the light guiding/scattering layer is provided on the light-emitting element and the light guiding/scattering layer is separated at least with respect to each pixel, similarly to the aforementioned embodiment, it is possible to obtain the effect of increasing the efficiency of light extraction from the light-emitting element.

Here, the light-emitting element means a portion of each pixel of the display apparatus that emits light to the outside. For example, regarding the display apparatus described with regard to the aforementioned embodiment, the light-emitting element corresponds to the organic light emitting layer (i.e., organic EL element) sandwiched between the first electrode and the second electrode. Furthermore, regarding the liquid crystal display, the light-emitting element corresponds to one pixel of a liquid crystal panel with a backlight. Moreover, regarding the plasma display, the light-emitting element corresponds to one discharge cell of the plasma display panel.

Note that the configuration below falls within the technical scope of the present disclosure.

(1)

A display apparatus including:

a plurality of light-emitting elements that constitutes pixels;

a light guiding/scattering layer that is provided on the plurality of light-emitting elements and scatters light emitted from the plurality of light-emitting elements; and a reflection partition wall that separates the light guiding/scattering layer at least with respect to each of the pixels and reflects the light emitted from the plurality of light-emitting elements.

(2)

The display apparatus according to (1), in which the reflection partition wall is provided with respect to each light-emitting element corresponding to each color constituting the pixel and separates the light guiding/scattering layer with respect to each of the light-emitting elements.

(3)

The display apparatus according to (1) or (2), in which the light guiding/scattering layer is formed such that a scattering body having a refractive index higher than a refractive index of a transparent material is dispersed in the transparent material.

(4)

The display apparatus according to (3), in which the scattering body includes any of $ZrO_2$, $BaTiO_2$, $TiO_2$, $ZnO$, $Y_2O_3$, or $Al_2O_3$.

(5)

The display apparatus according to (3) or (4), in which an average particle size of the scattering body is 0.4 μm or more and 2 μm or less.

(6)

The display apparatus according to any one of (1) to (5), in which the reflection partition wall includes a metal material or a semiconductor material.

(7)

The display apparatus according to any one of (1) to (5), in which the reflection partition wall includes a dielectric body having a refractive index lower than a refractive index of the transparent material.

(8)

The display apparatus according to any one of (1) to (7), in which a cross-sectional shape of the reflection partition wall in a stack direction is a reverse-tapered shape.

(9)

The display apparatus according to any one of (1) to (8), in which the plurality of light-emitting elements emits light having a wavelength band corresponding to white light, and a color filter corresponding to each color constituting the pixel is further provided above or below the light guiding/scattering layer.

(10)

The display apparatus according to any one of (1) to (8), in which each of the plurality of light-emitting elements emits light having a wavelength band corresponding to each color constituting the pixel.

(11)

An electronic device including:

a display unit including a plurality of light-emitting elements that constitutes pixels, a light guiding/scattering layer that is provided on the plurality of light-emitting elements and scatters light emitted from the plurality of light-emitting elements, and a reflection partition wall that separates the light guiding/scattering layer at least with respect to each of the pixels and reflects the light emitted from the plurality of light-emitting elements; and a display control unit that controls the display unit.

REFERENCE SIGNS LIST 1, 1A, 2, 2A, 3, 4, 5 Display apparatus
11 Support substrate
13 Light-emitting element
15 Light guiding/scattering layer
17 Reflection partition wall
100 Support substrate
110 Light-emitting element
120 Protective layer
130 Color filter layer
140 Reflection partition wall
150 Light guiding/scattering layer
151 Transparent material
153 Scattering body
160 Opposite substrate

The invention claimed is:

1. A display apparatus, comprising:
a plurality of light-emitting elements that constitutes a plurality of pixels, wherein each of the plurality of light-emitting elements is configured to emit white light;
a light guiding/scattering layer on the plurality of light-emitting elements, wherein the light guiding/scattering layer is configured to scatter the white light emitted from the plurality of light-emitting elements;
a reflection partition wall that separates configured to:
separate portions of the light guiding/scattering layer for each of the plurality of pixels, wherein each of the portions corresponds to a respective light-emitting element of the plurality of light-emitting element; and
reflect the white light emitted from the plurality of light-emitting elements; and
a plurality of color filters corresponding to a plurality of colors in each of the plurality of pixels, wherein the plurality of color filters is provided one of above or below the light guiding/scattering layer.

2. The display apparatus according to claim 1, wherein
the reflection partition wall is over perimeters of each of the plurality of light-emitting elements,
each of the plurality of light-emitting elements corresponds to a respective color of the plurality of colors in each of the plurality of pixels.

3. The display apparatus according to claim 1, wherein
the light guiding/scattering layer includes a scattering body and a transparent material,
a refractive index of the scattering body is higher than a refractive index of the transparent material, and
the scattering body is dispersed in the transparent material.

4. The display apparatus according to claim 3, wherein the scattering body further includes one of ZrO2, BaTiO2, TiO2, ZnO, Y2O3, or Al2O3.

5. The display apparatus according to claim 3, wherein
the scattering body includes a plurality of transparent particles, and
an average particle size of the plurality of transparent particles is 0.4 μm or more and 2 μm or less.

6. The display apparatus according to claim 1, wherein the reflection partition wall includes one of a metal material or a semiconductor material.

7. The display apparatus according to claim 3, wherein
the reflection partition wall includes a dielectric body, and
a refractive index of the dielectric body is lower than the refractive index of the transparent material.

8. An electronic device, comprising:
a display unit including a plurality of light-emitting elements that constitutes a plurality of pixels, wherein each of the plurality of light-emitting elements is configured to emit white light;

a light guiding/scattering layer on the plurality of light-emitting elements, wherein the light guiding/scattering layer is configured to scatter the white light emitted from the plurality of light-emitting elements;
a reflection partition wall configured to:
separate portions of the light guiding/scattering layer for each of the plurality of pixels, wherein each of the portions corresponds to a respective light-emitting element of the plurality of light-emitting element; and
reflect the white light emitted from the plurality of light-emitting elements;
a plurality of color filters corresponding to a plurality of colors in each of the plurality of pixels, wherein the plurality of color filters is provided above or below the light guiding/scattering layer; and
a display control unit that controls the display unit.

\* \* \* \* \*